United States Patent [19]
Shannon

[11] Patent Number: 4,522,501
[45] Date of Patent: Jun. 11, 1985

[54] MONITORING MAGNETICALLY PERMEABLE PARTICLES IN ADMIXTURE WITH A FLUID CARRIER

[75] Inventor: Michael A. Shannon, Glenburnie, Canada

[73] Assignee: Northern Telecom Limited, Montreal, Canada

[21] Appl. No.: 597,377

[22] Filed: Apr. 6, 1984

[51] Int. Cl.³ ...................... B01F 15/02; G05D 11/13; G01N 27/74; G01R 33/12

[52] U.S. Cl. .................................... 366/142; 324/204; 324/226; 366/152

[58] Field of Search ............... 366/132, 142, 151, 152; 324/204, 226, 228; 222/DIG. 1

[56] References Cited

U.S. PATENT DOCUMENTS 1,610,971 12/1926 Ruben ................................ 324/204
2,500,953 3/1950 Libman .......................... 324/204 X
3,609,526 9/1971 Chaberski ....................... 324/228 X

FOREIGN PATENT DOCUMENTS 217626 10/1961 Austria ............................... 366/152
728099 4/1980 U.S.S.R. ............................. 324/204

*Primary Examiner*—Philip R. Coe
*Attorney, Agent, or Firm*—R. J. Austin

[57] ABSTRACT

Method and apparatus to monitor the quantity of magnetically permeable particles in admixture with a fluid carrier in which the mixture is placed in a magnetic field having flux lines which change in direction or position. The mixture is out of physical contact with a source of the field and with a movable member the degree of movement of which is influenced by the strength of the field. The degree of movement of the member is monitored and this corresponds to the quantity of particles in the mixture.

12 Claims, 6 Drawing Figures

MONITORING MAGNETICALLY PERMEABLE PARTICLES IN ADMIXTURE WITH A FLUID CARRIER

This invention relates to the monitoring of magnetically permeable particles in admixture with a fluid carrier.

During certain stages of some manufacturing processes, it is necessary to hold quantities of magnetically permeable particles in mixtures with fluids. Process control requirements necessitate that such mixtures consist of specific volumetric or weight quantities of such particles and fluid to ensure that, in the finished product, desired results are obtainable with these specific amounts.

As an example of this, in the telecommunications cable industry, it is common practice to surround each electrical conductor with at least one layer of insulation which affects the electrical performance of the conductor, e.g. by producing a desired dielectric effect and helping to provide other design characteristics such as mutual capacitance between conductors. Inductive effect is also an important consideration and for various reasons, continuous inductive loadings have been proposed and used in dielectric layers of electrical conductors in the telecommunications industry. These continuous inductive loadings have comprised discrete particles of a magnetically permeable material, such as ferrite, which are dispersed throughout a dielectric carrier layer of polymeric substance such as rubber or other plastic. There are at least two problems which need to be overcome if electrical conductors having such continuous inductive loadings produce consistently the electrical characteristics for which they are designed. A first of these problems is the production of homogeneity in the mix which is produced with the polymeric material in a fluid state. Another problem concerns the control of the relative volumetric or weight quantities of the polymeric material and the particles within the mix. While for batch operations, it appears to be a relatively simple matter to measure the quantities before mixing in order to reduce chances of error, it would be preferable to have some method of monitoring the amounts of material in the actual mix. On the other hand, for continuous production in which a mix of a fluid and magnetically permeable particles is being replenished with these substances during continuous removal of the mix, it becomes more important to provide a method of monitoring the quantities of materials in the mix in order to control addition of the substances to maintain quantities in the mix between certain limits.

Accordingly, the invention provides a method of monitoring a quantity of magnetically permeable particles in admixture with a fluid carrier comprising providing a magnetic field with flux lines having a direction or position change, placing the mixture within the magnetic field while interposing it between and out of contact with a source of the field and with a movable member also disposed within the field, the movable member having a degree of movement caused and influenced by the strength of the field; influencing the effect of the field upon the movable member by the presence of the particles in the mixture to cause the member to move by a degree which corresponds to the strength of the field as affected by the quantity of the particles in the mixture, and monitoring the degree of movement of the movable member which corresponds to the quantity of the particles in a unit quantity of the mixture.

In the above method of the invention, the quantity of magnetically permeable particles may be measured according to any criteria which indicates the relationship of the particles to fluid carrier. For instance, this quantity may be by weight or volume, number of particles, or as a volumetric or weight ratio to the total mixture or to the fluid carrier.

The above method according to the invention may be used either for batch operation or for continuously monitoring the quantity of magnetically permeable particles in a continuously prepared mixture. In the latter case, the method includes continuously feeding the mixture into and through its position interposed between the source of the field and the movable member. The continuous replacement of the mixture in the interposed position enables the continuous monitoring operation to identify any change in quantity of magnetically permeable particles per unit quantity of the mixture. In a preferred method, the rates of feeding magnetically permeable particles and fluid carrier to a mixing device are continuously controlled and are governed by information in the form of signals which relate to the degree of movement of the movable member. Adjustment to the feeding rates then ensures that the quantity of particles is held between specified limits.

In the above process, eddy currents are generated in the movable member by the field, which is a primary field, and these eddy currents create a secondary magnetic field. The two magnetic fields are coupled together with an interacting magnetic effect which is influenced by the quantity of magnetically permeable particles interposed at any particular time, between the source of the primary field and the movable member. The movable member is preferably freely rotatable and its rate of rotation is controlled by rotational torque created by the coupling effect of the two fields. Alternatively, the movable member is pivotally movable against a biassing means and the degree of pivotal movement is caused again by rotational torque.

The invention also includes apparatus for monitoring the quantity of magnetically permeable particles in a mixture with a fluid carrier comprising means for generating, at a source, a magnetic field having flux lines which change direction or position, a movable member spaced from the field source to lie within the field when it is generated, the member capable of being influenced by the strength of the field at the member to move by a degree which corresponds to said strength of the field, a container for the mixture disposed between the source of the field and the movable member and means to monitor the degree of movement of the member.

For continuously monitoring the quantity of magnetically permeable particles, the container is provided with a spaced apart inlet and outlet to enable the mixture to flow continuously into, through and out from the container. In a preferred arrangement, the source of the magnetic field comprises a rotatable annular magnet. The container and the movable member may lie outside the confines of the magnet, but the container may be annular and lies within the magnet and is concentric with it. The rotatable member then lies within the confines of the container. For continuous monitoring, the container is preferably formed from a tube which is wound in helical convolutions which are preferably side-by-side. These convolutions lie within the annular magnet and are concentric with it with one end of the convolutions having an inlet and the other end an outlet.

Embodiments of the invention will now be described by way of example, with reference to the accompanying drawings in which.

Figure 1:
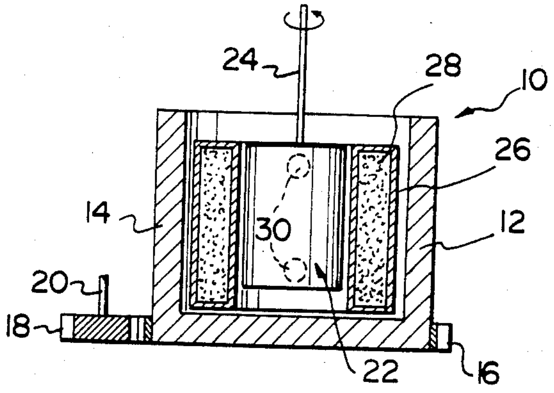
FIG. 1 is a cross-sectional view through apparatus of a first embodiment for monitoring the quantity of magnetically permeable particles in a mixture with a fluid carrier.

As shown in FIG. 1, in a first embodiment apparatus 10 for monitoring the quantity of magnetically permeable particles in a batch mixture including a fluid carrier comprises a means for generating a rotating magnetic field to change flux lines positions, this means consisting of a permanent magnet 12. The magnet 12 is cup shaped as shown in FIG. 1 and has an annular side wall 14 which provides north and south poles of the permanent magnet at its upper and lower ends. Means is provided for rotating the magnet 12 and this means conveniently comprises a gear arrangement driven by a power source (not shown), such as an electric motor. The gear arrangement as shown in FIG. 1, includes an annular gear 16 secured to the lower half of the wall 14 and a drive gear 18 having a drive shaft 20 connecting it to the power source.

Disposed concentrically within the magnet 12 is a movable member in the form of a rotatable disc or cylinder 22. This disc or cylinder is rotatable upon a shaft 24 held in bearings (not shown). The material of the disc 22 is aluminum but may be of any other nonmagnetic or magnetic metal.

Disposed between the magnet 12 and the disc 22 is an annular container 26 for containing the mixture 28 of magnetically permeable particles in a fluid carrier such as a liquid plastics material. The container is also concentrically arranged with regards to the magnet 12 and is provided with means (not shown) for holding it in this position.

In use of the apparatus of FIG. 1, the mixture 28 is placed into the container 26. The permanent magnet 12 is then rotated by the gear arrangement shown. A primary magnetic field of known flux intensity is thereby caused to rotate without interchanging the positions of the north and south poles, by the movement of the flux lines of the field around the shaft 24 of the disc 22. The magnetic field created by the magnet 12 causes eddy currents to form in the disc or cylinder 22. The strength of these eddy currents, shown diagrammatically at 30 in FIG. 1, is affected by the quantity of magnetically permeable particles in the mixture 28. These particles have the effect of cutting through the flux lines of the magnetic field so that the strength of the eddy currents in the disc 22 decreases as the quantity of magnetic particles in the mixture increases. The eddy currents in turn create a secondary magnetic field and this secondary magnetic field is coupled to the primary magnetic field. As a result of the rotation of the magnet 12 and its own magnetic field, the coupling effect causes rotation of the secondary magnetic field and thereby rotates the disc or cylinder 22. The disc or cylinder rotates at an angular speed which corresponds to the strength of the eddy currents and also to the coupling effect between the two magnetic fields. Thus the speed of angular rotation of the disc or cylinder 22 directly corresponds to the quantity of magnetically permeable particles in the mixture 28 with the disc rotating under the torque created by the coupling effect. With the shaft 24 coupled to an appropriate dial or meter (not shown), the degree of movement of the disc or cylinder may be monitored, i.e. its rotational speed. This monitoring is given as information regarding the angular velocity of the disc or cylinder which may then be translated into quantity of magnetically permeable particles in the mixture. This quantity may be measured either by weight or by volume as a percentage of the total volume of the mixture or as a comparison with the fluid carrier quantity. Alternatively it may be given as a ratio to the fluid carrier or to the total mixture. As a further alternative, the information may be conveyed upon the meter or dial as a direct measurement of the quantity of the magnetically permeable particles in the mixture.

In the above embodiment, the strength of the magnetic field should be sufficient to cause rotation of the disc or cylinder with any change in field strength being measurable as a change in speed of rotation.

Figure 2:
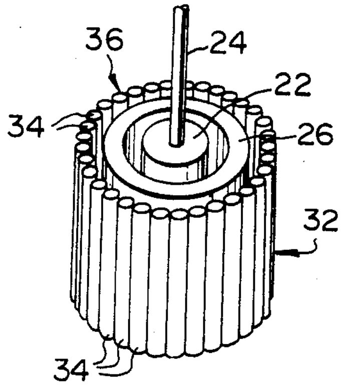
FIG. 2 is a perspective view 1 of a second embodiment.

In a second embodiment as shown in FIG. 2, the apparatus 32 is similar to the apparatus of FIG. 1 in having the disc 22 and container 26. Instead of having the permanent magnet 12, however, a magnetic field is created in the apparatus 32 by a plurality of coils 34, which are disposed side-by-side to form an annular configuration 36. The north poles of the coils 34 are disposed at one end of the annular configuration and the south poles at the other. Each coil is connected at its two ends into an a.c. or d.c. electric circuit and a control (not shown) is provided for passing current through the coils, one coil at a time, in sequence around the annular configuration 36. The effect of this to cause the primary magnetic field of the annular configuration effectively to rotate around the disc or cylinder 22. Rotation of the magnetic field acts upon the disc in the manner described in the first embodiment, i.e. to cause the disc to set up a secondary magnetic field which couples with the primary field to thereby cause rotation of the disc. The quantity of magnetically permeable particles in the mixture may then be measured in the manner described in the first embodiment.

Figure 3:
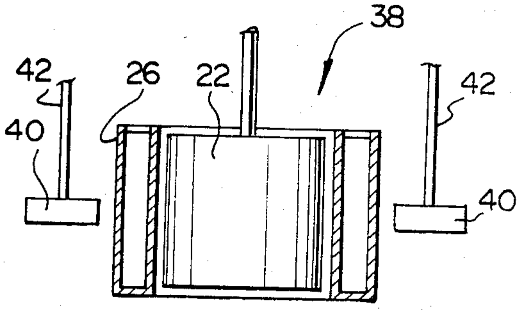
FIG. 3 is a cross-sectional view of a third embodiment.

In a third embodiment shown in FIG. 3, apparatus 38 for monitoring the quantity of magnetically permeable particles in a mixture comprises a container 26 and disc or cylinder 22 of the construction described in the first embodiment. Instead of the permanent magnet 12 of the first embodiment, the third embodiment has two permanent bar units 40 disposed diametrically opposite to each other, one on each side of the container 26.

In use, the magnets 40 are rotated at the same angular speed about spindles 42 with the north pole of each of the magnets approaching the container simultaneously with the approach of the south pole of the other magnet. A primary magnetic field which is created between the two magnets thereby has its flux direction changed alternately from one magnet to the other. This change in direction serves to affect the coupling between this field and the secondary magnetic field created around the disc or cylinder 22 so as to effect rotation of the disc.

The flux intensity or strength of the primary field created by the magnets 40 affects the speed of rotation of the cylinder 22 and the quantity of magnetically permeable particles in the mixture is measured in the manner described in the first embodiment.

Figure 4:
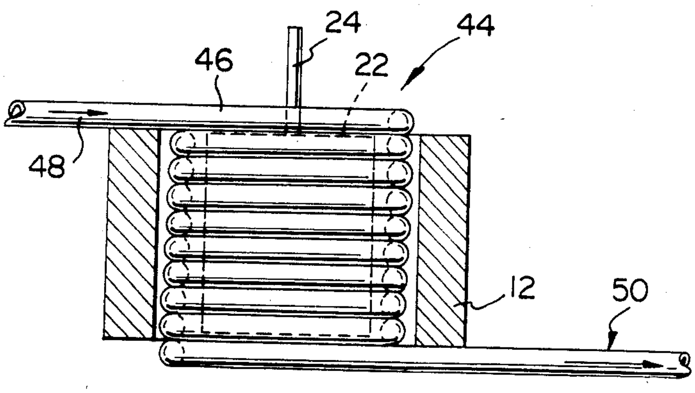
FIG. 4 is a cross-sectional view through apparatus of a fourth embodiment.
Figure 5:
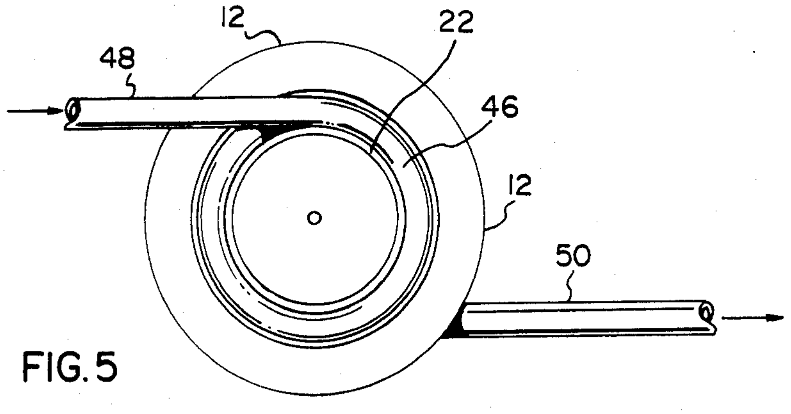
FIG. 5 is a plan view of the apparatus of FIG. 4.

In a fourth embodiment shown by FIGS. 4 and 5, apparatus for monitoring the quantity of magnetically permeable particles is used for the continuous monitoring of the particles in a continuous mixing operation, accompanied by continuous transfer of the mixture to an applicator for applying the mixture as an insulating layer upon a telecommunications conductor. As shown by FIGS. 4 and 5, the apparatus 44 comprises a rotatable member in the form of a disc or cylinder 22 as shown in the first embodiment. Surrounding this is disposed a container in the form of a tube 46, which is formed into side-by-side helical convolutions which touch each other as shown by FIG. 4. The convolutions have an inlet 48 at the top and an outlet 50 at the bottom of the side-by-side helical windings. Surrounding the tube 46 is a permanent magnet 12, as described in the first embodiment having a means such as the gears (not shown) for effecting rotation.

In use of the apparatus shown in FIGS. 4 and 5, the mixture of material is fed through the convolutions continuously and the angular velocity of the disc 22 indicates at any particular time the quantity of magnetically permeable particles in the convolutions. This quantity of particles will change if the mixture varies in quantities of carrier and particles, as it is being fed into the inlet 48. Any change in the amount of the particles is immediately identified by an associated change in the angular velocity of the disc or cylinder 22.

Figure 6:
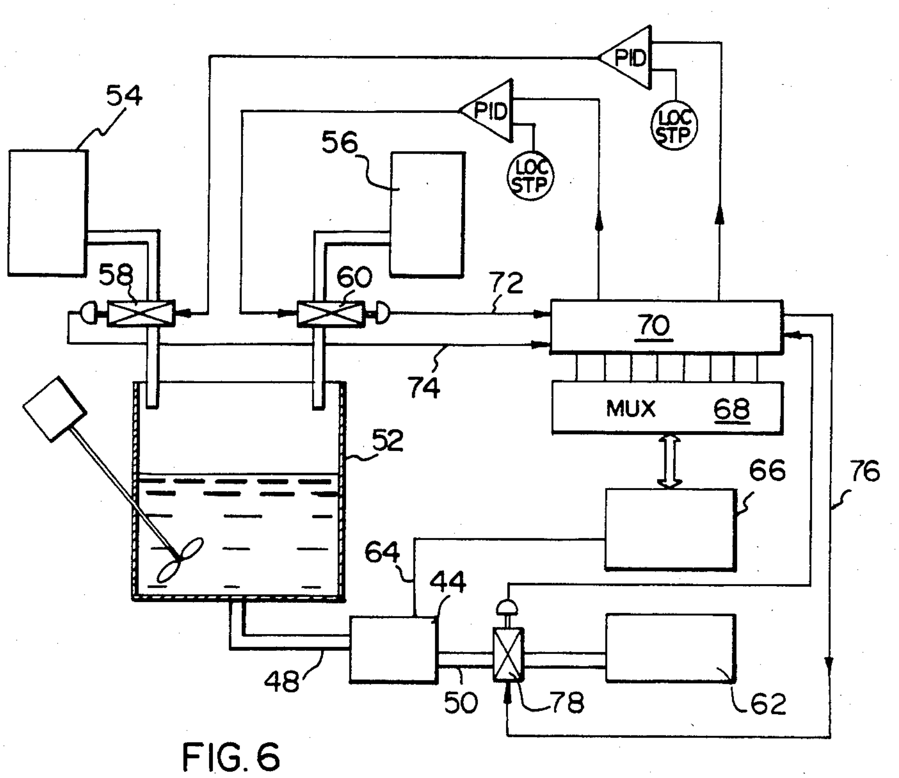
FIG. 6 is a diagrammatic layout of apparatus for coating a telecommunications conductor with an insulating layer of material and including the apparatus of the fourth embodiment.

In a practical sense, the apparatus 44 is used in the continuously operating arrangement shown in FIG. 6. As shown in that Figure, the mixture of materials is prepared in a mixing tank 52 with the separate constituents fed from a particle container 54, and a fluid carrier 56 through valves 58 and 60. After passage of the mixture from the tank 52 through the inlet 48 of the tube 46 and from the outlet 50, the mixture then passes to an application container 62, which is an extrusion device (not shown in detail) for applying a surrounding extrusion of the mixture to an electrical conductor (not shown). An electrical signal is generated, the strength of which is dependent upon the angular speed of rotation of the spindle 24 of the disc 22. This signal which may be a voltage, current or frequency signal is fed along line 64 to a microprocessor 66, which compares that signal with a datum signal which corresponds to the desired quantity of magnetically permeable particles in the fluid carrier. If there is any difference between the received and the datum signals, then the microprocessor sends a message to a multiplexer switch 68 which operates through an input output module 70 to vary the opening and closing of the switches 58 and 60, so as to alter the amount of magnetically permeable particles per unit quantity of the mixture in the mixing tank 52. The mixture then being fed through the inlet 48 into the apparatus 44 will alter in quantity of particles and fluid carrier, whereby the speed of the disc will send a signal to the microprocessor which more closely approaches the datum signal with which it is being compared. Hence the apparatus 44 operates to monitor the amount of magnetically permeable particles passing through the tube 46 on a continuous basis during the continuous application of the material to the telecommunications conductor. In addition, the total arrangement is controlled to ensure that the mixture in the tank 52 contains a certain quantity of magnetically permeable particles per unit quantity of the mixture within specified limits.

In the above arrangement shown by FIG. 6, there is also provided a feedback loop 72 and 74 from the valves 58 and 60 to the module 70, by which the valves 58 and 60 send a message to the module concerning the new valve position after any movement. This information is then compared with the information sent out from the module to ensure that the valves have been moved to the positions desired. In addition, a further loop 76 is provided from the module to a valve 78 between the apparatus 44 and the application container 62 and this loop carries a signal from the module to the valve for the intention of closing down the valve completely in the event that the amount of magnetically permeable particles in the mixture has departed outside the set limits and is not being controlled. Closing of this valve then stops operation of the complete arrangement while any fault which may have occurred is identified.

What is claimed is:

1. A method of monitoring a quantity of magnetically permeable particles in admixture with a fluid carrier comprising providing a magnetic field with flux lines having a direction or position change, placing the mixture within the magnetic field while interposing it between and out of physical contact with a source of the field and with a movable member also disposed within the field, the movable member having a degree of movement caused and influenced by the strength of the field; influencing the effect of the field upon the movable member by the presence of the particles in the mixture to cause the member to move by a degree which corresponds to the strength of the field in the region of the member as affected by the quantity of particles in the mixture and affected by the field, and monitoring the degree of movement of the movable member, said movement also corresponding to the quantity of magnetically permeable particles in a unit quantity of the mixture.

2. A method according to claim 1 comprising causing the field to rotate the movable member at an angular velocity which corresponds to the strength of the field in the region of the member.

3. A method according to claim 1 comprising continuously feeding the mixture through an inlet into a container disposed in a position interposed between the field source and the movable member, through the container and out from an outlet of the container so as to continuously replace the mixture in the container, continuously effecting movement of the movable member by a degree which corresponds to the strength of the field in the region of the member, sending a signal corresponding to the degree of movement of the movable member to a control means, and the control means operating dependent upon the value of said signal to adjust input of ingredients into the mixture so as to control the quantities of the magnetically permeable particles in the mixture between specified limits.

4. Apparatus for monitoring the quantity of magnetically permeable particles in a mixture with a fluid carrier comprising means for generating at a source, a magnetic field with flux lines which change position or direction, a movable member spaced from the field source to lie within the field when it is generated, the member capable of being influenced by the strength of the field at the member to move by a degree which corresponds to said strength of the field, a container for the mixture disposed between the source of the field and the movable member and means to monitor the degree of movement of the member.

5. Apparatus according to claim 4 wherein the movable member is freely rotatable and its angular velocity when rotated corresponds to the quantity of magnetically permeable particles in a unit quantity of mixture.

6. Apparatus according to claim 5 wherein the container is annular and concentrically surrounds the movable member and the source of the magnetic field is annular and concentrically surrounds the container.

7. Apparatus according to claim 5 wherein the source of the field comprises a rotatable annular permanent magnet with means to rotate the magnet around the container.

8. Apparatus according to claim 5 wherein the source of the field comprises a plurality of coils arranged side-by-side in annular configuration surrounding the container, the coils connectable individually to a source of electrical current and being connectable and disconnectable with the current source in succession around the annulus.

9. Apparatus according to claim 4 wherein the container comprises a spaced inlet and outlet to enable the mixture to flow into, through and out from the container.

10. Apparatus according to claim 9 wherein the container comprises a tube which is wound into helical convolutions which surround the movable member and the source of the magnetic field is annular and concentrically surrounds the container.

11. Apparatus according to claim 10 wherein the helical convolutions lie side-by-side and substantially in contact with one another.

12. Apparatus for controlling the quantities of magnetically permeable particles in a unit quantity of a mixture with a fluid carrier during continuous preparation and removal of the mixture comprising a mixing device, valve means controlling openings for the separate ingredients into the mixing device, apparatus for monitoring the quantity of magnetically permeable particles according to claim 9, control means to receive a signal relating to the degree of movement of the movable member, the control means operable to adjust the position of either valve and affect the rate of flow of either ingredient to adjust the quantity of magnetically permeable particles within the mixture in the mixing device within set limits, operation of the control means to adjust a valve dependent upon the electrical signals received by the control means.

* * * * *